(12) United States Patent
Holweg et al.

(10) Patent No.: US 9,312,250 B2
(45) Date of Patent: Apr. 12, 2016

(54) CHIP, CHIP ARRANGEMENT AND METHOD FOR PRODUCING A CHIP

(71) Applicant: Infineon Technologies Austria AG, Villach (AT)

(72) Inventors: Gerald Holweg, Graz (AT); Thomas Herndl, Biedermannsdorf (AT); Guenter Hofer, St. Oswald (AT); Walther Pachler, Graz (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 14/468,352

(22) Filed: Aug. 26, 2014

(65) Prior Publication Data

US 2015/0054125 A1 Feb. 26, 2015

(30) Foreign Application Priority Data

Aug. 26, 2013 (DE) .......................... 10 2013 109 200

(51) Int. Cl.

| | |
|---|---|
| *H01M 10/42* | (2006.01) |
| *H01L 25/16* | (2006.01) |
| *H01L 25/00* | (2006.01) |
| *H01L 23/522* | (2006.01) |
| *H01L 23/58* | (2006.01) |
| *H01L 23/66* | (2006.01) |
| *H01L 23/48* | (2006.01) |

(52) U.S. Cl.
CPC ............... *H01L 25/16* (2013.01); *H01L 23/48* (2013.01); *H01L 23/5227* (2013.01); *H01L 23/58* (2013.01); *H01L 23/66* (2013.01); *H01L 25/50* (2013.01); *H01L 2223/6677* (2013.01); *H01L 2924/0002* (2013.01)

(58) Field of Classification Search
CPC .. H01M 6/40; H01M 10/425; H01M 10/4257
See application file for complete search history.

(56) References Cited

U.S. PATENT DOCUMENTS

| | | | | |
|---|---|---|---|---|
| 6,370,046 | B1 * | 4/2002 | Nebrigic et al. | ................. 363/60 |
| 8,680,810 | B1 * | 3/2014 | Okandan | ........... H01M 10/0436 320/107 |
| 2004/0185323 | A1 * | 9/2004 | Fowler et al. | ................... 429/38 |
| 2009/0097181 | A1 * | 4/2009 | Tamegai | ..................... 361/91.5 |
| 2010/0003544 | A1 * | 1/2010 | Pijnenburg | ............ H01M 4/505 429/7 |
| 2011/0076567 | A1 * | 3/2011 | Bouillon | ............. H01M 4/0423 429/246 |
| 2011/0097609 | A1 * | 4/2011 | Jenson et al. | ..................... 429/7 |
| 2011/0278363 | A1 | 11/2011 | Pirk et al. | |
| 2014/0264798 | A1 * | 9/2014 | Otremba et al. | ............. 257/675 |
| 2015/0054518 | A1 * | 2/2015 | Henrici | .................... H04Q 9/00 324/426 |

FOREIGN PATENT DOCUMENTS

| | | |
|---|---|---|
| DE | 102004039651 A1 | 3/2006 |
| DE | 102010028868 A1 | 11/2011 |

OTHER PUBLICATIONS

Bohne, "Integrierte 3D-Lithium-Ionen-Duennschichtbatterien:Duennschichtkathoden auf strukturierten Substraten und elektrochemische Eigenschaften", TU Darmstadt [Dissertation], Feb. 2012, 189 pages.

* cited by examiner

*Primary Examiner* — Jae Lee

(57) ABSTRACT

Various embodiments provide a chip. The chip has a carrier, an integrated circuit formed above the carrier, and an energy storage element. The energy storage element has a first electrode and a second electrode and is used to supply the integrated circuit with electrical energy. The carrier, the integrated circuit and the energy storage element are monolithically formed, the first electrode being formed from the carrier.

16 Claims, 2 Drawing Sheets

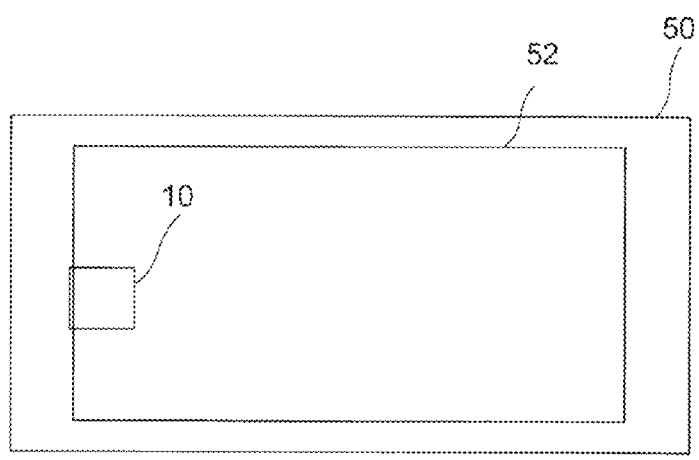

CHIP, CHIP ARRANGEMENT AND METHOD FOR PRODUCING A CHIP

CROSS-REFERENCE TO RELATED APPLICATION

This application claims priority to German Patent Application Serial No. 10 2013 109 200.4, which was filed Aug. 26, 2013, and is incorporated herein by reference in its entirety.

TECHNICAL FIELD

Various embodiments relate generally to a chip, a chip arrangement and a method for producing a chip.

BACKGROUND

In a conventional chip, an electronic circuit is monolithically formed with logic circuits on a carrier, for example a substrate. The electronic circuit may have, for example, a communication module for communicating, for example for interchanging data, with an external apparatus, for example an external reader. In order to assist with communication, an antenna may be monolithically integrated in the chip, for example. Such an antenna may have a coil (also referred to as coil on module), for example. A transmission and/or reception power and/or a connection quality can be positively influenced, for example, using a booster antenna outside the chip. The booster antenna may be coupled, for example inductively, to the antenna monolithically integrated on the chip.

The chip may be operated, for example, using an external energy source, for example a battery, which is electrically coupled to the chip, for example by means of a wire and/or a soldered connection, for example by means of a bond connection. Alternatively, the energy can be inductively transmitted, for example using the antenna, for example if the chip has an RFID apparatus or is an RFID apparatus. In order to inductively transmit energy for operating the chip, the chip must be arranged relatively close to the external apparatus transmitting the energy, for example the external reader, since a relatively large amount of energy is needed to operate the chip and must be transmitted. In more detail, the energy needed to operate the chip is, in principle, greater than the energy which is implicitly transmitted using the electromagnetic alternating field in order to read the data on the chip.

SUMMARY

Various embodiments provide a chip. The chip has a carrier, an integrated circuit formed above the carrier, and an energy storage element. The energy storage element has a first electrode and a second electrode and is used to supply the integrated circuit with electrical energy. The carrier, the integrated circuit and the energy storage element are monolithically formed, the first electrode being formed from the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows an embodiment of a chip arrangement.

DESCRIPTION

Figure 1:
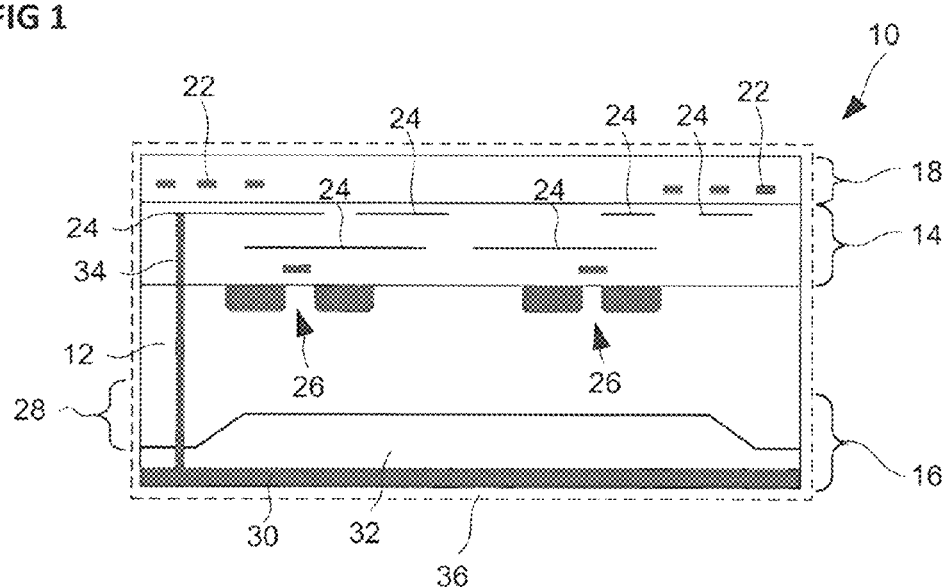
FIG. 1 shows an embodiment of a chip.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In the following detailed description, reference is made to the accompanying drawings which form part of this description and show, for the purpose of illustration, specific exemplary embodiments in which the invention can be carried out. In this respect, direction terminology, for instance "at the top", "at the bottom", "at the front", "at the rear", "front", "rear", etc., is used with respect to the orientation of the described figure(s). Since components of embodiments can be positioned in a number of different orientations, the direction terminology is used for illustration and is not restrictive in any way. It goes without saying that other embodiments can be used and structural or logical changes can be made without deviating from the scope of protection of the present invention. It goes without saying that the features of the different embodiments described herein can be combined with one another unless specifically indicated otherwise. Therefore, the following detailed description should not be interpreted in a restrictive sense, and the scope of protection of the present invention is defined by the attached claims.

Within the scope of this description, the terms "linked", "connected" and "coupled" are used to describe both a direct and an indirect link, a direct or indirect connection and direct or indirect coupling. In the figures, identical or similar elements are provided with identical reference symbols if expedient.

Various embodiments provide a chip and/or a chip arrangement which make(s) it possible to easily produce and/or operate an electronic circuit of the chip and/or has/have a long range during contactless communication.

Various embodiments provide a chip. The chip has a carrier, an integrated circuit formed above the carrier, and an energy storage element. The energy storage element has a first electrode and a second electrode and is used to supply the integrated circuit with electrical energy. The carrier, the integrated circuit and the energy storage element are monolithically formed, the first electrode being formed from the carrier.

The energy storage element is used as an energy source for the integrated circuit of the chip. The chip is therefore independent of an external energy source. This can contribute to being able to dispense with electrical coupling, for example using an electrically conductive wire, to an external energy source, for example an externally arranged battery. This can contribute to producing the chip and/or the chip arrangement in a simple and/or cost-effective manner Furthermore, a range during contactless communication with the chip can be particularly long since no energy for operating the chip must be transmitted via the corresponding electromagnetic field, as is necessary in the case of inductive coupling for supplying energy for example, but rather only the data have to be transmitted. Furthermore, the monolithically integrated energy storage element can contribute to being able to operate the chip in a particularly simple manner and/or makes it possible to use the chip for a variety of applications in which it is advantageous that there is no need for a physical connection to the external apparatus.

In various embodiments, the chip has an antenna which is formed above the carrier and is coupled to the integrated circuit. The antenna contributes to the integrated circuit being able to communicate with an external reading apparatus in a contactless manner, for example without a wire connection. The antenna may contribute, for example, to achieving a particularly long range during contactless communication. Furthermore, the antenna may be used for inductive coupling to a booster antenna, as a result of which the range for transmitting data can be increased further. The antenna is arranged and designed, for example, in such a manner that the integrated circuit is arranged between the antenna and the carrier. The antenna may be electrically coupled to the integrated circuit, for example by means of a conductor track and/or a via of the chip. The antenna may have a coil, for example. Alternatively, the chip may be capacitively coupled to the external reading apparatus, for example, and the data can be transmitted using the capacitive coupling. For the capacitive coupling, the semiconductor chip may have electrodes which form a capacitor and are electrically coupled to the integrated circuit.

Communication with the external reading apparatus may be effected in a passive, active, semi-active, bidirectional and/or unidirectional manner Furthermore, communication can be effected at one or more carrier frequencies, for example using ultra-wideband (UWB) technology.

In various embodiments, the antenna, the carrier, the integrated circuit and the energy storage element are monolithically integrated in the chip. This contributes to there being no need for physical coupling, for example by means of a wire connection, between the semiconductor chip and an external apparatus, for example an external antenna, for communication. This may contribute to being able to operate the chip in a particularly simple manner and/or makes it possible to use the chip for a variety of applications in which it is advantageous that there is no need for a physical connection to the external apparatus.

In various embodiments, the second electrode is arranged on a side of the carrier facing away from the integrated circuit. For example, the carrier is arranged between the second electrode and the integrated circuit. This makes it possible for the integrated circuit to be formed in a first area of the chip and for the energy storage element to be formed in a second area of the chip, in which case the first and second areas are separated from one another, for example by means of a core area of the carrier.

In various embodiments, the second electrode is electrically coupled to the integrated circuit by means of an electrically conductive line, and the carrier has a cutout through which the line extends. This easily makes it possible to electrically couple the integrated circuit to the energy storage element. The line may be formed, for example, from a plated-through hole and/or a continuous via (vertical interconnect access).

In various embodiments, an electrolyte is arranged between the first electrode and the second electrode. This makes it possible to operate the energy storage element as a battery or a rechargeable battery.

In various embodiments, the first electrode is an anode of the energy storage element and the second electrode is a cathode of the energy storage element.

In various embodiments, the antenna has a coil.

In various embodiments, the chip has an encapsulation material in which the carrier, the integrated circuit, the energy storage element and possibly the antenna are encapsulated. The fact that the carrier, the integrated circuit, the energy storage element and possibly the antenna are encapsulated may mean, for example, that the carrier, the integrated circuit, the energy storage element and possibly the antenna are hermetically sealed with respect to external liquids and/or gases by means of the encapsulation material. The encapsulation material may contribute to protecting the chip from external influences, for example. The external influences may be chemical and/or physical influences, for example. The chemical influences may be, for example, interactions with liquids, for example water or blood, or with gases, for example oxygen or nitrogen. The physical influences may be, for example, mechanical influences, for example impacts or strikes, or thermal influences, for example cold or heat. For example, the encapsulation material may make it possible to use the chip in the body of a living being, for example in order to monitor blood glucose in the human body or for identification in the body of a domestic animal. Alternatively, the encapsulation material may make it possible to use the chip in a refrigerator or a cold store or a drying room. The encapsulation material may have, for example, glass or plastic, for example a synthetic resin.

In various embodiments, the chip has a sensor which is monolithically integrated in the chip. The sensor may make it possible to use the chip as a sensor element, for example. The sensor may be, for example, a temperature sensor, a pressure sensor, a light sensor, a humidity sensor or a sensor for detecting a chemical composition of a substance, for example a liquid.

In various embodiments, the energy storage element is a battery. This can contribute to being able to reliably operate the energy storage element over a long period without charging.

In various embodiments, the energy storage element is a rechargeable battery. This makes it possible to charge the energy storage element and can contribute to being able to operate the chip over a long period.

In various embodiments, the chip has an energy generation module for charging the rechargeable battery. The energy generation module is monolithically integrated in the chip. The energy generation module makes it possible to charge the rechargeable battery without physical coupling, for example a wire connection, to an external charging apparatus. The energy generation module has a photodiode, a solar cell and/or an induction coil, for example.

Various embodiments provide a chip arrangement having a chip, for example the chip explained above, and having a booster antenna. The booster antenna is coupled to the integrated circuit of the chip. For example, the booster antenna is inductively coupled to the antenna of the chip which is electrically coupled to the integrated circuit of the chip. The booster antenna can therefore be indirectly coupled to the integrated circuit via the antenna of the chip.

Various embodiments provide a method for producing a chip, for example the chip explained above. In this case, the integrated circuit is formed above the carrier. The energy storage element which has a first electrode and a second electrode and is used to supply the integrated circuit with electrical energy is monolithically formed with the carrier and the integrated circuit, the first electrode being formed from the carrier.

FIG. 1 shows a chip 10 which may be a semiconductor chip, for example. The chip 10 has a carrier 12, an integrated circuit 14 and an energy storage element 16. The energy storage element 16 is monolithically integrated in the chip 10 and is used to supply the integrated circuit 14 with electrical energy. The chip 10 may have an antenna 18, for example. The carrier 12 with the integrated circuit 14 and possibly the antenna 18 may be referred to as a substrate.

The chip 10 may form an RFID transponder, for example an RFID tag, and/or may be set up to communicate with an external reader, for example. The chip 10 may be set up, for example, to monitor a temperature, for example a food storage temperature, a tire pressure and/or parameters of a body, for example a human or animal body, for example without the supply of external energy, for example via an RFID field. This makes it possible to achieve a long range of the chip 10 during communication with an external reader and/or during data transmission since only data are transmitted and no energy for operating the chip 10 must be received. The data can be transmitted, for example, in an inductive, capacitive, passive, active, semi-active, bidirectional or unidirectional manner and/or at a plurality of different frequencies.

The carrier 12 may be formed from a wafer substrate. The carrier 12 may be produced from one or more semiconductor materials, for example silicon, germanium, one or more semiconductor materials of main groups III to V or the like, or from one or more polymers, even though other suitable materials may likewise be used in other embodiments. In different exemplary embodiments, the carrier 12 may be produced from silicon (doped or undoped); in alternative embodiments, the carrier 12 may be a silicon-on-insulator (SOI) substrate. In further embodiments, any other suitable semiconductor material may be provided for the carrier 12, for example a semiconductor composite material, for example gallium arsenide (GaAs), indium phosphide (InP), or else any suitable ternary or quaternary semiconductor composite material, for example indium gallium arsenide (InGaAs).

The integrated circuit 14 may have, for example, one, two or more interconnections 24 and/or one, two or more transistors 26. The transistors 26 may be in the form of, for example, metal oxide semiconductor (MOS) transistors, for example PMOS transistors and/or NMOS transistors. The integrated circuit 14 may be completely or partially integrated in the carrier 12, in which case the transistors 26 may be completely or partially integrated in the carrier 12, for example. The carrier 12 and the integrated circuit 14 are monolithically formed. The integrated circuit 14 may have a wiring structure 404 with a metallization plane or with a plurality of metallization planes, in which case an intermediate dielectric (for example an oxide, for example silicon oxide, a nitride, for example silicon nitride, or a low-k dielectric or a high-k dielectric) may be provided between the metallization planes. The plurality of metallization planes can be connected to one another in an electrically conductive manner by means of one or more contact holes (not illustrated).

The integrated circuit 14 may also have a storage element (not illustrated) and/or a rectifier circuit (not illustrated), for example a wide-range rectifier and/or implemented in the form of a full-bridge circuit or half-bridge circuit, for example. The rectifier circuit can be designed, for example, to rectify (generally to process) broadband signals, in other words signals over a wide frequency range. The rectifier circuit may be set up to process signals in a frequency range of at least 25% relative to a predefined carrier frequency, for example of at least 50%, for example of at least 75%, for example of at least 95% or more. The carrier frequency may be in a range of approximately 13.56 MHz (HF standard) or of approximately 433 MHz or of approximately 868 MHz or of approximately 2.4 GHz (UHF standard), for example.

In different embodiments, the rectifier circuit may be set up to process signals in a frequency range of greater than 100 MHz (for example of greater than 200 MHz, 300 MHz, 400 MHz, 500 MHz, 600 MHz, 700 MHz, 800 MHz, 900 MHz, 1 GHz, 1.5 GHz, 2 GHz or even greater) around a carrier frequency (naturally dependent on the carrier frequency in each case), for example in a frequency direction (for example a frequency range greater or less than the carrier frequency), or in both frequency directions (for example a frequency range greater and less than the carrier frequency) starting from the carrier frequency.

The rectifier circuit may be set up in such a manner that it does not have any AC coupling and/or already begins to operate from 0 Hz, and it may be set up to process signals at a frequency up to a maximum switching frequency of the transistors 26 of the rectifier circuit.

If the antenna 18 is arranged, it can be monolithically formed with the carrier 12 and the integrated circuit 14, for example as a coil on module. The antenna 18 has a coil 22 which may have, for example, a plurality of turns which are shown in the sectional illustration in FIG. 1. The antenna 18 may be connected to the integrated circuit 14, for example via an electrically conductive plated-through hole (not illustrated).

The energy storage element 16 has a first electrode 28 and a second electrode 30. The first electrode 28 is formed from the carrier 12, for example from a section of the carrier 12. That section of the carrier 12 which forms the first electrode faces away from the integrated circuit 14. An electrolyte 32, for example, may be arranged between the first electrode 28 and the second electrode 30. The second electrode 30 may be electrically coupled to the integrated circuit 14 by means of an electrically conductive line 34. The line 34 may extend through a cutout in the carrier 12 and/or the integrated circuit 14, for example. The line 34 may be referred to as a plated-through hole or a through-silicon via, for example. The energy storage element 16 is used to supply the integrated circuit 14 with electrical energy. As a result, the chip 10 is independent of an external energy supply. The energy storage element 16 may be a battery or a rechargeable battery, for example. The area of the carrier 12 between the integrated circuit 14 and the first electrode 28 may be referred to as the core area of the carrier 12. The core area of the carrier 12 separates the integrated circuit 14 from the energy storage element 16.

The chip 10 may have an encapsulation material 36 in which the carrier 12, the integrated circuit 14, the energy storage element 16 and possibly the antenna 18 may be encapsulated. For example, the encapsulation material 36 hermetically encapsulates the rest of the chip 10 from an area surrounding the chip 10. The encapsulation material may have, for example, glass or plastic, for example a synthetic resin.

Figure 2:
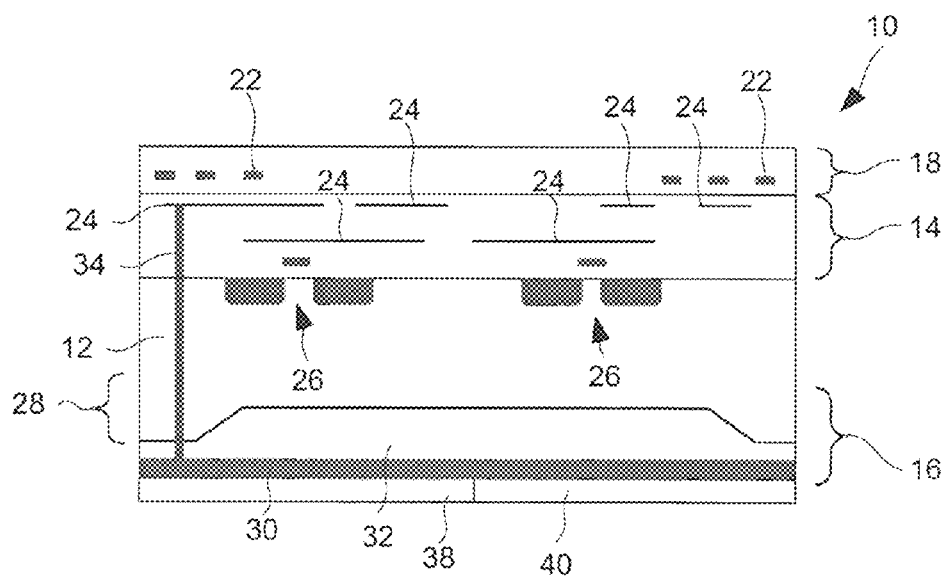
FIG. 2 shows an embodiment of a chip.

FIG. 2 shows an embodiment of a chip 10 which may largely correspond to a refinement of the chip 10 explained above, for example. The chip 10 has a sensor 38. Alternatively or additionally, the chip 10 may have an energy generation module 40, for example.

The sensor 38 may be, for example, a temperature sensor, a humidity sensor, a pressure sensor and/or a sensor for detecting a property of a liquid or gas.

The energy generation module 40 may be, for example, a photodiode, a solar cell and/or an induction coil. The induction coil may be operated using an external alternating magnetic field, for example. The energy storage element 16, for example, can be charged using the energy generation module 40 if the energy storage element 16 is in the form of a rechargeable battery.

In a method for producing one of the chips 10 explained above, the corresponding chip 10 can be produced with a plurality of further chips 10 in a wafer assembly, for example on a common and/or integral wafer substrate. The integrated circuit 14 may be formed above the carrier 12. Furthermore, the energy storage element 16 may be formed below the carrier, the energy storage element 16 having the first electrode 28 and the second electrode 30. The energy storage element 16 is monolithically formed with the carrier 12 and the integrated circuit 14. The first electrode 28 is formed from the carrier 12. After the chips 10 have been singulated from the wafer assembly, for example after the chips 10 have been cut or sawn, they can be completely produced, for example, with the result that there is no need for a further manufacturing step, for example wiring to an external energy source. The chip 10 can be completely usable after production, for example. There is no need for any further components, for example electrical/galvanic connections. Only when the encapsulation material 36 is provided must it also be formed on the chip 10.

FIG. 3 shows an embodiment of a chip arrangement 50. The chip arrangement 50 may be part of a chip card, for example. The chip arrangement 50 may have a chip 10 and a booster antenna 52, for example. The chip 10 may correspond, for example, to a refinement of the chip 10 explained above. The chip 10 is coupled to the booster antenna 52. For example, the antenna 18 of the chip 10 may be inductively coupled to the booster antenna 52. The booster antenna 52 may have a plurality of coil turns which are not illustrated in FIG. 3, for example.

The booster antenna 52 is clearly a simple resonant circuit. In the latter, a large conductor loop is used to inductively couple in energy. In order to achieve a booster effect, a small part of the conductor loop, which is also referred to as the coupling area, is formed such that it substantially surrounds the antenna 18. The coupling area is used to form further inductive coupling, to the antenna 18 in this case, with the result that it is possible to communicate with the integrated circuit 14 via the antenna 18 using this inductive coupling. Very good coupling is achieved as a result of the geometrical approach of the antenna 18 and a part of the conductor loop, that is to say the coupling area. The following generally applies: the more similar and closer the conductor loops are to one another, the better their inductive coupling.

The invention is not restricted to the stated embodiments. For example, the integrated circuit 14 may have more or fewer electrical components, for example resistors, coils, transistors and/or storage elements. Furthermore, the antenna 18 may have further coils 22 and/or further windings. Furthermore, the sensor 38 and/or the energy generation module 40 may also be arranged in the embodiment of the chip 10 as illustrated in FIG. 1. Furthermore, the embodiment of the chip 10 as shown in FIG. 2 may also have the encapsulation material 36. Both the chip 10 according to FIG. 1 and the chip 10 according to FIG. 2 can be coupled to the booster antenna 52.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip, comprising:
   a carrier;
   an integrated circuit formed above the carrier; and
   an energy storage element having a first electrode and a second electrode for supplying the integrated circuit with electrical energy;
   wherein the carrier, the integrated circuit and the energy storage element are monolithically formed; wherein the carrier is arranged between the second electrode and the integrated circuit; and
   wherein the first electrode is formed within the carrier.

2. The chip of claim 1, further comprising:
   an antenna which is formed above the carrier and is coupled to the integrated circuit.

3. The chip of claim 2,
   wherein the antenna is monolithically integrated in the chip with the carrier, the integrated circuit and the energy storage element.

4. The chip of claim 1,
   wherein the second electrode is arranged on a side of the carrier facing away from the integrated circuit.

5. The chip of claim 4,
   wherein the second electrode is electrically coupled to the integrated circuit by means of an electrically conductive line; and
   wherein the carrier has a cutout through which the line extends.

6. The chip of claim 1,
   wherein an electrolyte is arranged between the first electrode and the second electrode.

7. The chip of claim 1,
   wherein the first electrode is an anode of the energy storage element and the second electrode is a cathode of the energy storage element.

8. The chip of claim 2,
   wherein the antenna has a coil.

9. The chip of claim 1, further comprising:
   an encapsulation material in which the carrier, the integrated circuit, and the energy storage element are encapsulated.

10. The chip of claim 9,
    wherein also the antenna is encapsulated by means of the encapsulation material.

11. The chip of claim 1, further comprising:
    a sensor which is monolithically integrated in the chip.

12. The chip of claim 1,
    wherein the energy storage element is a battery.

13. The chip of claim 1,
    wherein the energy storage element is a rechargeable battery.

14. The chip of claim 1, further comprising:
    an energy generation module for charging the rechargeable battery, which module is monolithically integrated in the chip.

15. A chip arrangement, comprising:
    a chip, comprising:
       a carrier;
       an integrated circuit formed above the carrier; and
       an energy storage element having a first electrode and a second electrode for supplying the integrated circuit with electrical energy;
       wherein the carrier, the integrated circuit and the energy storage element are monolithically formed; wherein the carrier is arranged between the second electrode and the integrated circuit; and wherein the first electrode is formed within the carrier;

a booster antenna which is coupled to the integrated circuit of the chip.

16. A method for producing a chip, the method comprising:

forming an integrated circuit over a carrier; and forming an energy storage element having a first electrode and a second electrode for supplying the integrated circuit with electrical energy monolithically with the carrier, the integrated circuit and the energy storage element;

wherein the first electrode is formed within the carrier; and wherein the carrier is arranged between the second electrode and the integrated circuit.

* * * * *